United States Patent
Li et al.

(10) Patent No.: US 6,861,209 B2
(45) Date of Patent: Mar. 1, 2005

(54) METHOD TO ENHANCE RESOLUTION OF A CHEMICALLY AMPLIFIED PHOTORESIST

(75) Inventors: Waikin Li, Poughkeepsie, NY (US); Chung-Hsi Wu, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 190 days.

(21) Appl. No.: 10/309,404

(22) Filed: Dec. 3, 2002

(65) Prior Publication Data

US 2004/0106070 A1 Jun. 3, 2004

(51) Int. Cl.[7] .................................................. G03F 7/26
(52) U.S. Cl. ........................................ 430/325; 430/330
(58) Field of Search .............................. 430/322, 323, 430/325, 330

(56) References Cited

U.S. PATENT DOCUMENTS

| | | | | |
|---|---|---|---|---|
| 5,429,910 A | * | 7/1995 | Hanawa | 430/313 |
| 5,750,312 A | * | 5/1998 | Chandross et al. | 430/273.1 |
| 5,858,620 A | * | 1/1999 | Ishibashi et al. | 430/313 |
| 6,274,289 B1 | | 8/2001 | Subramanian et al. | 430/273.1 |

OTHER PUBLICATIONS

Ivan Pollentier et al., Sub–50nm gate patterning using line–trimming with 248 or 193nm litho; Microlithography World; May 2002; pp. 4, 6, 8, 25.

* cited by examiner

*Primary Examiner*—Kathleen Duda
(74) *Attorney, Agent, or Firm*—Lisa U. Jaklitsch; Cantor Colburn LLP

(57) ABSTRACT

A method to enhance resolution of a chemically amplified photoresist generally includes forming a relief image in the chemically amplified photoresist, wherein the relief image comprises a feature having a first dimension; and contacting the relief image with an aqueous acidic solution for a period of time effective to reduce first dimension of the relief image to a second dimension.

16 Claims, 3 Drawing Sheets

DEPOSIT LAYER OF CHEMICALLY AMPLIFIED PHOTORESIST ONTO A SUBSTRATE

LITHOGRAPHICALLY PATTERN AND DEVELOP THE CHEMICALLY AMPLIFIED PHOTORESIST LAYER (PAB; EXPOSURE; PEB; DEVELOPMENT)

DEPOSIT ACIDIC AQUEOUS SOLUTION AND OPTIONALLY HEAT THE SUBSTRATE

AQUEOUS RINSE TO REMOVE ACIDIC AQUEOUS SOLUTION

PATTERNED PHOTORESIST

PATTERNED PHOTORESIST
AFTER PROCESSING

METHOD TO ENHANCE RESOLUTION OF A CHEMICALLY AMPLIFIED PHOTORESIST

BACKGROUND

The present disclosure relates generally to chemically amplified photoresists for use in the manufacture of integrated circuit devices, and more particularly, to a method for increasing resolution of a patterned chemically amplified photoresist.

In the manufacture of semiconductor integrated circuits, many well known photolithography techniques are used to pattern the various functional features on different levels of an integrated circuit chip. Generally, photolithography involves selectively exposing regions of a photoresist coated silicon wafer to a light radiation pattern, and then developing the exposed photoresist in order to selectively protect regions of wafer layers, such as metallization layers, oxide dielectric layers, polysilicon layers, silicon layers, and the like, from subsequent etching operations.

As is well known, a photoresist is a light radiation-sensitive material that is typically spin-coated over a selected layer of a silicon wafer. The photoresist material is classified as either positive or negative depending on how it chemically reacts to light radiation during exposure. Positive photoresist, when exposed to radiation becomes more soluble and is thus more easily removed during the development process. In contrast, negative photoresist will generally become less soluble when exposed to radiation, thereby enabling the removal of non-exposed regions.

A chemically amplified photoresist is a photoresist to which an acid catalyst reaction is applied. The chemically amplified photoresist generally comprises a base resin having acid labile pendant groups, a photoacid generator, small amounts of additives for performance adjustment, and an organic solvent for spin coating the photoresist onto a substrate. Chemically amplified photoresist compositions may rely on deprotection reactions per unit of photogenerated acid to effect a change in dissolution properties between exposed and unexposed regions. In the deprotection mechanism, upon exposure to activating radiation, a catalytic amount of hydrogen ions (acid) is generated by the photoacid generator, which catalytically cleaves the pendant acid labile groups from the base resin to form polar groups and render the irradiated photoresist soluble to alkali. Those areas of the photoresist that were not exposed to activating radiation are generally not soluble in alkali, thereby providing a dissolution differential between exposed and unexposed regions during development. Following development, the surface of the semiconductor substrate can be selectively etched by using the photoresist pattern described above as a mask.

Although chemically amplified photoresists work relatively well, as smaller and smaller feature sizes are designed for higher performance integrated circuit devices, the resolution of these high performance designs have been exemplifying less than acceptable resolution due to poor photoresist development. Moreover, resolution is limited by the wavelength of exposure.

BRIEF SUMMARY

Disclosed herein is a method to enhance resolution of a chemically amplified photoresist. The method comprises forming a relief image of the chemically amplified photoresist on a substrate, wherein the relief image comprises a feature having a first dimension; and contacting the relief image with an aqueous acidic solution for a period of time effective to reduce first dimension of the relief image to a second dimension.

In another embodiment, the method comprises forming a relief image of the chemically amplified photoresist on a substrate, wherein the relief image comprises a feature having a first dimension; and contacting the relief image with an aqueous acidic solution for a period of time effective to reduce first dimension of the relief image to a second dimension, wherein the acidic solution comprises an acid compound having a pKa less than about 6; and rinsing the substrate to remove the aqueous acidic solution.

The above described and other features are exemplified by the following figures and detailed description.

BRIEF DESCRIPTION OF THE DRAWINGS

Referring to the exemplary drawings wherein like elements are numbered alike in the several Figures.

DETAILED DESCRIPTION

Figure 1:
FIG. 1 illustrates a process flow for processing a chemically amplified photoresist.
Figure 1:
Figure 1:
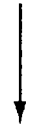
Figure 2:
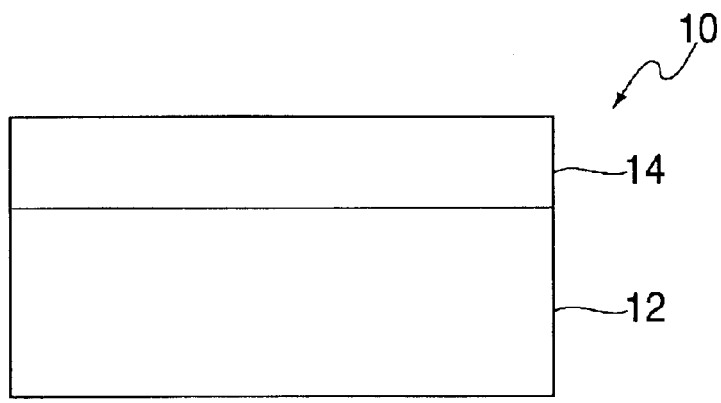
FIGS. 2–5 shows a cross sectional view of a photoresist coated on substrate and processed in accordance with the process flow of FIG. 1.
Figure 3:
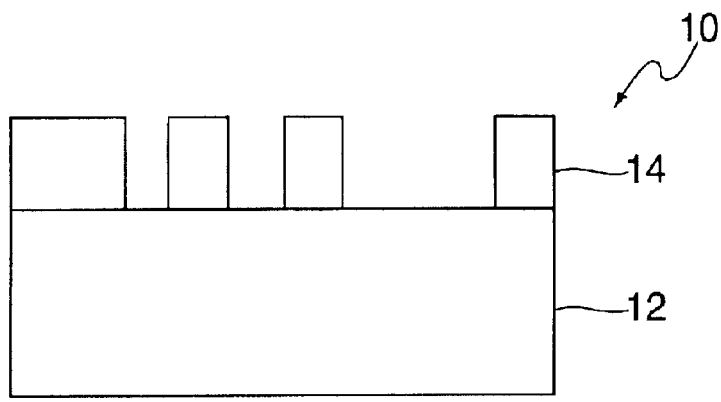

Disclosed herein is a process for processing a patterned photoresist layer. The process, as shown in FIG. 1, generally comprises depositing a layer of a chemically amplified photoresist onto a substrate; lithographically patterning and developing the chemically amplified photoresist layer to form a relief image, wherein the relief image comprises various photoresist features having a first dimension; depositing an aqueous acidic solution onto the relief image to reduce the first dimension to a second dimension; and rinsing the substrate. As will be described in greater detail, reducing the various photoresist features from the first dimension to the second dimension increases the resolution pattern of the relief image beyond the aerial image constraints physically associated with projection lithography.

The aqueous acidic solution preferably comprises an acid compound and water. While not wanting to be bound by theory, it is believed that depositing the aqueous acidic solution onto the relief image reduces the first dimension to a second dimension by cleaving acid labile pendant groups of the photoresist polymer at an interface between the relief image and the aqueous acidic solution. Hydronium ion or hydrogen ions from the acid compound can then further diffuse into the patterned photoresist causing further deprotection of the acid labile pendant groups within the photoresist base resin. The extent of reduction is determined by the penetrative depth of the acid compound and the degree of deprotection of the acid labile groups, which can be modulated by the type of acid compound employed and the process conditions. Thus, the first dimension provided in the photoresist relief image is reduced to a second dimension resulting in feature sizes that may not be obtainable by conventional photolithography methods.

Suitable acid compounds include inorganic acids, organic acids or combinations of the inorganic and/or organic acids. In a preferred embodiment, the acid compounds have a pKa equal to or less than about 6, with a pKa equal to or less than about 4 more preferred, and a pKa equal to or less than about 2 most preferred.

Specific examples of inorganic acids include nitric acid, halogen acids such as hydrofluoric acid, hydrochloric acid, hydrobromic acid and hydriodic acid, sulfuric acid, sulfurous acid, perchloric acid, boric acid or phosphorus acids such as phosphorus acid and phosphoric acid, or a combination comprising at least one of the foregoing inorganic acids.

Organic acids include carboxylic acids and polycarboxylic acids such as alkanoic acids, including formic acid, acetic acid, propionic acid, butyric acid and so on, dichloroacetic acid, trichloroacetic acid, perfluoroacetic acid, perfluorooctanoic acid, (generally containing 1 to about 10 carbon atoms), dicarboxylic acids, such as oxalic acid, malonic acid, succinic acid and so on (generally containing 1 to about 12 carbon atoms), hydroxyalkanoic acids, such as citric acid (generally containing 1 to about 10 carbon atoms), organic phosphorus acids such as dimethylphosphoric acid and dimethylphosphinic acid, sulfonic acids such as alkylsulfonic acids (containing 1 to about 20 carbon atoms) including methanesulfonic acid, ethanesulfonic acid, 1 pentanesulfonic acid, 1-hexanesulfonic acid, 1-heptanesulfonic acid, aromatic sulfonic acids such as benzenesulfonic acid, benzenedisulfonic acid, tolulenesulfonic acid, naphthalenesulfonic acid, or a combination comprising at least one of the foregoing organic acids.

The aqueous acidic solution preferably contains a suitable amount of the acid compound to cause deprotection of the acid labile groups at the surface of the resist and present in the base resin. Preferably, the aqueous acid solution from about 0.001% to about 10% by weight of at least one acid compound, with about 0.01% to about 5% by weight of at least one acid compound more preferred, and with about 0.05% to about 1% by weight of at least one acid compound most preferred. Generally, a higher acid compound concentration in the solution leads to a greater reduction in dimension. The aqueous acidic solution may optionally further contain various additives such as coating forming additives, surfactants, mobility enhances, and the like.

The time which the aqueous acidic solution is permitted to contact the photoresist relief image depends primarily upon the identity of the acid compound, the concentration of the acid compound in solution, the type of resist, and the desired size or thickness of the deprotected photoresist layer. Although slightly shorter or longer times may be permitted, the aqueous acidic solution preferably contacts the photoresist relief image for a period of time of about 1 second to about 10 minutes, with about 10 seconds to about 5 minutes more preferred, and with about 15 seconds to about 2 minutes most preferred.

Optionally, heat is applied when the aqueous acidic solution is contacted with the photoresist relief image. Preferably, the aqueous acidic solution is applied at a temperature of about 20° C. to about 100° C., with about 30° C. to about 80° C. more preferred, and with about 30° C. to about 50° C. most preferred. Alternatively, the substrate having the photoresist relief image thereon is heated to the preferred temperatures such that aqueous acidic solution are heated upon contact with the substrate.

The first dimension is preferably reduced to a second dimension that is at least about 10% smaller in thickness and width, with a reduction of at least about 20% smaller more preferred, with a reduction of at least about 30% even more preferred, and with a reduction of at least about 50% most preferred.

Suitable chemically amplified photoresists include those chemically amplified photoresists used in DUV, 193 nm, and 157 nm applications or the like. This includes, but is not limited to, novolaks, polyvinylphenols, acetals, acrylates, cyclic olefins, and the like. Other chemically amplified photoresist formulations will be apparent to those skilled in the art in view of this disclosure. Chemically amplified photoresists are commercially available from a number of sources including, Hoechst Celanese, Shipley Company, JSR Microelectronics, Clariant, Arch Chemical, and Tokyo Ohka Kogyo Company.

The chemically amplified photoresist generally comprises a base polymer resin having acid labile pendant groups. Generally, the polymer is a polymer or copolymer of vinyl phenol and optionally other copolymerizable groups. Copolymers comprise units of substituted or unsubstituted phenols and non-aromatic groups, particularly copolymers of vinyl phenols and alkyl acrylates, typically alkyl acrylates having from 1 to about 12 carbon atoms. For example, the polymer may include at least one of poly(p-tertbutoxycarbonyloxy-αa-methylstyrene), poly(p-tert-butoxycarbonyloxystyrene), poly(tert-butyl p-vinylbenzoate), poly(tert-butyl p-isopropenylphenyloxyacetate), poly(tert-butyl methacrylate), polymethylmethacrylate, acrylate based polymers, a novolak/diazonaphthoquinione resin, a nitrene crossed hydroxystyrene polymer, and poly(butene-1-sulfone). In another example, the polymer comprises phenolic and cyclic alcohol units, hydroxystyrene and acrylate, methacrylate, mixtures of acrylate and methacrylate, adamantyl methacrylate, 3-oxo-cyclohexyl methacrylate, tetrahydropyranymethacrylate, trycyclodecanyl acrylate, isobornyl polymers, polynorbornene, polyanthrylmethacrylate, poly(vinylmethyl ether-co-maliec anhydride), poly(styrene-co-maleic anhydride). The polymeric material may include a partially tbutoxycarbonyloxy substituted poly-p-hydroxystyrene, partially t-butoxycarbonyloxy substituted poly-3-hydroxyphenyl phenylsiloxane, partially t-butyl substituted polymethacrylate, and partially adamantyl substituted polymethacrylate.

Generally, the acid labile pendant groups attached to the photoresist base resin polymer are tert-butyl esters of carboxylic acids and tert-butyl carbonates of phenols, including trityl, benzyl, benzyhydryl, and modifications thereof. Alternatively, the acid labile groups include acetate groups such as acetate groups of Formula (I) $CR^1R^2C(\!=\!O)OR^3$, where $R^1$ and $R^2$ are each independently one of hydrogen, an electron withdrawing group such as halogen, lower alkyl having from 1 to about 10 carbon atoms, and substituted lower alkyl having from 1 to about 10 carbon atoms; and $R^3$ is substituted and unsubstituted lower alkyl having from 1 to about 10 carbon atoms, substituted and unsubstituted aryl having from 1 to about 10 carbon atoms, substituted or unsubstituted benzyl having from about 7 to about 13 carbon atoms. The substituents can be, for example, one or more halogen, lower alkyl, lower alkoxy, aryl or benzyl. $R^1$ and $R^2$ may each be hydrogen, or fluorine. The acid labile groups may include oxycarbonyl groups of the formula $C(\!=\!O)OR^3$, where $R^3$ is the same as defined above. Other examples of the acid labile group include tertiary alkoxy groups such as tert-butoxy; tert-butyl methacrylate, carbonate groups such as tert-butoxycarbonyloxy; tertiary carboxylate groups such as tertbutoxycarbonylmethyloxy; trialkylsilyloxy groups such as trimethylsilyloxy, triethylsilyloxy, and tert-butyl-dimethylsilyloxy; and acetal and ketal groups such as tetrahydrofuranyloxy, tetrahydropyranyloxy, 2-methoxytetra-hydropyranyloxy, methoxymethyloxy, 1-ethoxyethoxy, 1-propoxyethoxy, 1-n-butoxyethoxy, 1-isobutoxyethoxy, 1-sec-butoxyethoxy, 1-tert-butoxyethoxy, 1-amyloxyethoxy, 1-ethoxy-1-methylethoxy, 1-propoxy-1-methylethoxy, 1-n-butoxy-1-methylethoxy, 1-isobutoxy-1-methylethoxy, 1-sec-butoxy-1-methylethoxy, 1-tert-butoxy-1-methylethoxy, and 1-amyloxy-1-methylethoxy groups. Examples of the aromatic group having an acid labile group are tert-butoxyphenyl, tertbutoxycarbonylmethyloxyphenyl, (1-ethoxyethoxy)

phenyl, tetrahydropyranyloxyphenyl, and tetrahydrofuranyloxyphenyl groups.

Referring now to FIGS. 2–5, a structure 10 is provided upon which a semiconductor device may be formed. The structure 10 includes a substrate 12 and a chemically amplified photoresist deposited 14 onto the substrate 12. Although not shown, the substrate 12 may include of one or more layers including substrate layers, diffusion regions, dielectric layers such as oxides, devices, polysilicon layers, and the like. The photoresist layer is lithographically patterned and developed to form a relief image. The relief image comprises various features, e.g., lines, pad areas, and the like, having a first dimension.

Figure 4:
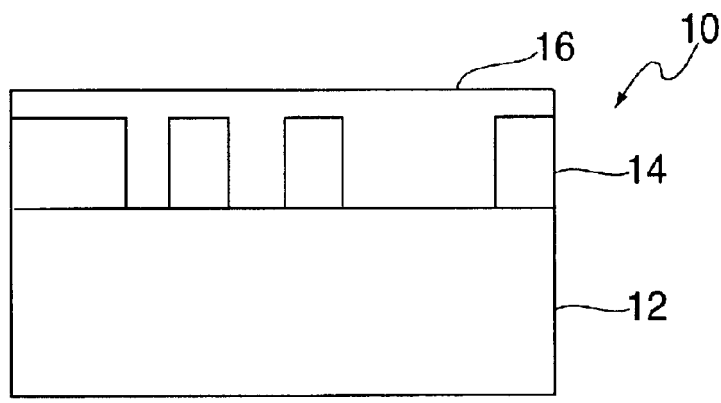
Figure 5:
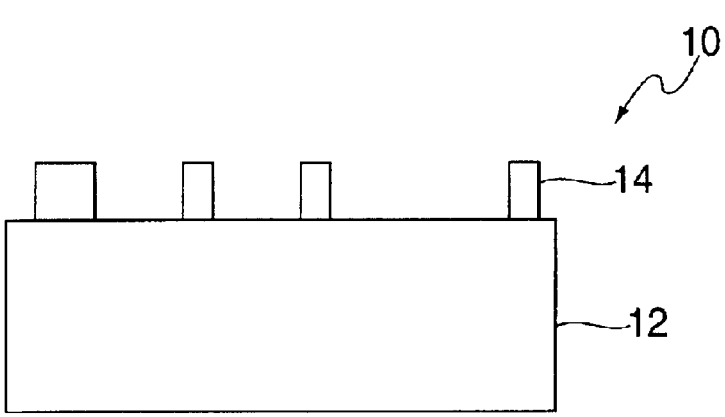

As shown in FIG. 4, an aqueous acidic solution 16 is then deposited onto the relief image for a period of time effective to reduce the first dimension to a desired second dimension. Mobile hydrogen ions or hydronium ions from the aqueous acid solution diffuse into the resist 14 and begin to form a deprotected resist layer by cleaving acid labile moieties of the photoresist polymer material. Once the relief image has the desired second dimension, the substrate is rinsed with water or an alkali developer to remove the acidic solution and prevent a further reduction in the dimension. Determining the desired second dimension may be time based, wherein a deprotection rate is known.

EXAMPLE 1

In this example, a substrate was coated with 82 nanometers of an antireflective coating commercially available under the trademark AR19 from the Shipley Company. A chemically amplified photoresist optimized for 193 nm lithography was then deposited at a thickness of 355 nanometers. The chemically amplified photoresist is commercially available under the trademark PAR715 from the Sumitomo Company, Japan. A relief image was formed employing an ArF lithographic scanner and developed. The relief image was then coated with an aqueous acidic solution. The aqueous acidic solution comprised perfluoroalkylsulfonic acid. The wafer was then heated to a temperature of about 130° C. for a period of about 30 seconds.

Figure 6:
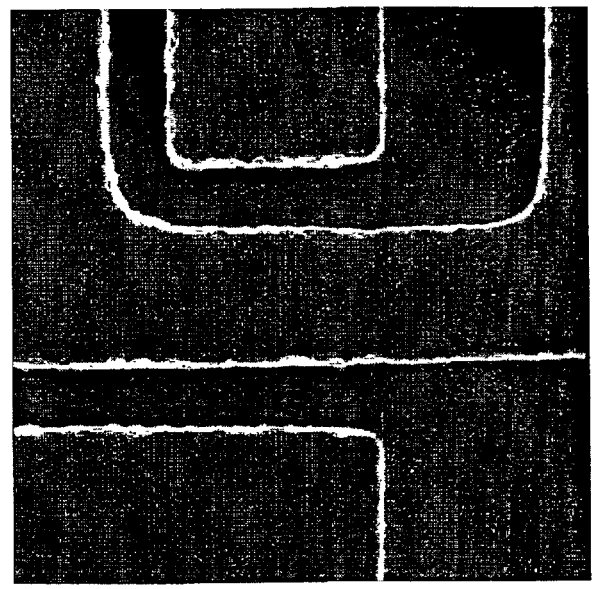
FIG. 6 illustrates scanning electron micrographs of a top down view of a patterned photoresist before and after processing in accordance with the process flow of FIG. 1.
Figure 6:
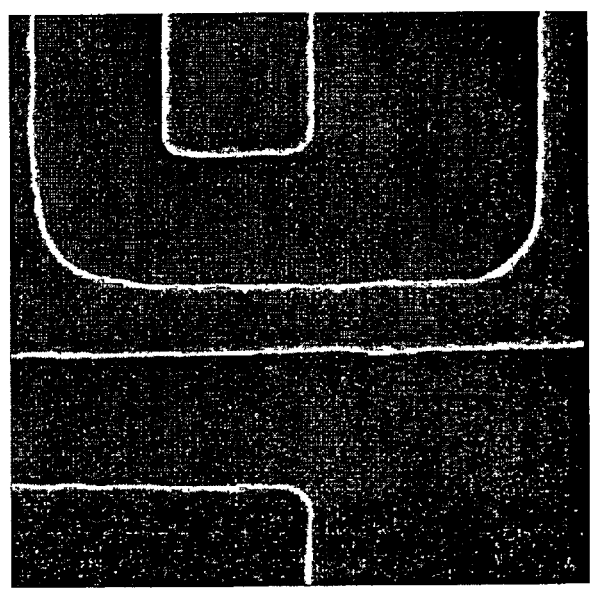

FIG. 6 shows scanning electron micrographs of a chemically amplified photoresist relief image before and after processing. The critical dimension measured prior to processing was 840 nanometers. After processing the relief image, the critical dimension was reduced to 440 nanometers.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method to enhance resolution of a chemically amplified photoresist, the method comprising:
    forming a relief image of the chemically amplified photoresist on a substrate, wherein the relief image comprises a feature having a first dimension; and
    contacting the relief image with an aqueous acidic solution for a period of time effective to reduce first dimension of the relief image to a second dimension.

2. The method of claim 1, wherein the aqueous acidic solution comprises an acid compound.

3. The method of claim 2, wherein the acid compound has a pKa equal to or less than about 6 and is effective to remove an acid labile group in a base resin of the photoresist.

4. The method of claim 1, wherein the aqueous acidic solution comprises an inorganic acid compound, wherein the inorganic acid compound comprises nitric acid, halogen acid, sulfuric acid, sulfurous acid, perchloric acid, boric acid, phosphorus acid, or a combination comprising at least one of the foregoing inorganic acids.

5. The method of claim 1, wherein the aqueous acidic solution comprises an organic acid compound, wherein the organic acid compound comprises carboxylic acid, dicarboxylic acid, polycarboxylic acid, hydroxyalkanoic acid, organic phosphoros acid, sulfonic acid, or combinations comprising at least one of the foregoing organic acids.

6. The method of claim 1, further comprising heating the aqueous acidic solution to a temperature of about 20° C. to about 100 ° C.

7. The method of claim 1, wherein the second dimension comprises a smaller width dimension and a smaller height dimension than the first dimension.

8. The method of claim 1, further comprising heating the substrate to a temperature of about 20° C. to about 100 ° C. prior to depositing the aqueous acidic solution.

9. A method to enhance resolution of a chemically amplified photoresist, the method comprising:
    forming a relief image of the chemically amplified photoresist on a substrate, wherein the relief image comprises a feature having a first dimension; and
    contacting the relief image with an aqueous acidic solution for a period of time effective to reduce first dimension of the relief image to a second dimension, wherein the acidic solution comprises an acid compound having a pKa less than about 6; and
    rinsing the substrate to remove the aqueous acidic solution.

10. The method of claim 9, wherein rinsing the substrate to remove the aqueous acidic solution comprises applying an alkaline developer solution to the substrate.

11. The method of claim 9, further comprising heating the substrate to a temperature of about 20° C. to about 100° C. prior to depositing the aqueous acidic solution.

12. The method of claim 9, wherein reducing the first dimension of the relief image to a second dimension comprise reducing a width dimension and a height dimension of the relief image.

13. The method of claim 9, further comprising heating the substrate to a temperature of about 20° C. to about 100° C. prior to depositing the aqueous acidic solution.

14. The method of claim 9, further comprising heating the aqueous acidic solution to a temperature of about 20° C. to about 100° C.

15. The method of claim 9, wherein the aqueous acidic solution comprises an inorganic acid compound, wherein the inorganic acid compound comprises nitric acid, halogen acid, sulfuric acid, sulfurous acid, perchloric acid, boric acid, phosphorus acid, or a combination comprising at least one of the foregoing inorganic acids.

16. The method of claim 9, wherein the aqueous acidic solution comprises an organic acid compound, wherein the organic acid compound comprises carboxylic acid, dicarboxylic acid, polycarboxylic acid, hydroxyalkanoic acid, organic phosphorus acid, sulfonic acid, or combinations comprising at least one of the foregoing organic acids.

* * * * *